United States Patent [19]

Bader

[11] 4,291,300

[45] Sep. 22, 1981

[54] TRACKING ANALOG-TO-DIGITAL CONVERTER FOR AC SIGNALS

[75] Inventor: Clifford J. Bader, West Chester, Pa.

[73] Assignee: Burroughs Corporation, Detroit, Mich.

[21] Appl. No.: 90,253

[22] Filed: Nov. 1, 1979

[51] Int. Cl.[3] .................... H03K 13/02

[52] U.S. Cl. .................... 340/347 AD; 332/11 D; 340/347 M; 375/28

[58] Field of Search .................... 375/28, 33; 340/347 M, 340/347 AD; 332/11 D

[56] References Cited

U.S. PATENT DOCUMENTS

| | | | |
|---|---|---|---|
| 3,322,942 | 5/1967 | Gerard et al. | 364/832 X |
| 3,461,406 | 8/1969 | Kroll | 375/28 X |
| 3,487,204 | 12/1969 | Emmerich | 340/347 NT X |
| 3,855,555 | 12/1974 | Burkhard et al. | 375/28 X |
| 3,956,700 | 5/1976 | Condon | 375/33 X |
| 4,196,419 | 4/1980 | Brown | 340/347 AD |

*Primary Examiner*—Thomas J. Sloyan
*Attorney, Agent, or Firm*—Francis A. Varallo; Kevin R. Peterson; Edmund M. Chung

[57] ABSTRACT

An electronic circuit is described for providing an analog-to-digital conversion system having an output "delta" format in which a pulse is produced for each defined change in the amplitude of the input signal. The circuit is characterized by minimal hardware complexity and low current drain. In performing its conversion function, the circuit advantageously employs a single capacitor for coupling the input signal into the system as well as for storing precisely controlled voltage increments for effecting the equality of the input signal and a reference potential. The AC coupling afforded by this configuration eliminates the problems attendant with the digitization of a small AC signal superimposed on a large DC component. Additionally, the circuit of the present invention lends itself to the multiplexing of input signals.

10 Claims, 3 Drawing Figures

$-I_2$
$+I_2$
30
26
28
10
+V
COMPARATOR
16a
+V
ANALOG INPUT SOURCE
14
12
-V
D
Q
FF
CL
$\bar{Q}$
-V
34
$-\Delta V$ OUT
$\Delta t$
$I_1$
INVERTER
22
24
20
+V
16b
32
$+\Delta V$ OUT
$\Delta t$
+V
0
-V
$\Delta t$
CLOCK PULSE SOURCE
18
16
DIGITAL LOGIC
-V CONTROL
ANALOG INPUT SOURCE
14a
10a
ANALOG SWITCH
48
54

CONTROL
14b
10b
50
30
+V
AMPLIFIER
44
22
-V
CONTROL
14c
10c
52
46
24
CHANNEL SELECTOR
56
MULTIPLEX CIRCUIT CLOCK
58

ANALOG INPUT SOURCE
14
10
30
22
24
AMPLIFIER
44
46
COMPARATOR
12
CLOCK PULSE SOURCE
18
ANALOG SWITCH
36
ANALOG SWITCH
38
CONTROL
40
CONTROL
42
IN
OUT
+V
−V
+V
0
−V
Δt
FF
D
CL
Q
$\bar{Q}$
16a
16b
INVERTER
20
DIGITAL LOGIC
16
34
32
−ΔV OUT
+ΔV OUT

TRACKING ANALOG-TO-DIGITAL CONVERTER FOR AC SIGNALS

BACKGROUND OF THE INVENTION

The basic elements of an analog-to-digital conversion system are a digital-to-analog conversion device and a comparator. The comparator detects equality of the input signal with its digitally produced counterpart and a feedback loop adjusts the latter until such equality is obtained. The digital-to-analog device may be resistive in nature, such as a weighted network or R/2R ladder, in which case any output voltage may be maintained indefinitely. Alternatively, the device may utilize a capacitor for storing fixed charge increments. In this case, the finite leakages involved limit voltage maintenance to periods of time, which are nevertheless adequate for many applications. Analog-to-digital converters may be further characterized by output format, which may be a digital word representing the input amplitude, or a pulse representing a defined change in the input amplitude. The present invention is concerned with the design of a practical capacitive storage, tracking analog-to-digital converter for providing the latter format, sometimes referred to as a "delta" format.

Analog-to-digital conversion systems are well known in the electronics field. However, undesirable characteristics inherent in many present day systems include a high component count and circuit complexity, problems stemming from the digitization of small AC signals in the presence of large DC components and difficulties in the multiplexing of input signals.

The present analog-to-digital converter obviates all of the aforementioned problems.

SUMMARY OF THE INVENTION

In accordance with the present invention, a circuit configuration is provided which reduces control of the voltage increments employed to effect equality of the input signal and a reference potential to three parameters, namely, the system supply voltages, one resistor value and the storage capacitance.

More specifically, a single storage capacitor responsive to the aforementioned voltage increments also serves as a coupling capacitor for the input signals. Since the converter is inherently AC coupled, DC level problems are eliminated. The system further includes a comparator having a first of its pair of input terminals coupled to one side of the storage capacitor and its second terminal, to a reference potential incrementally varied by a source of clock pulses. This incremental variation of the reference potential permits detection of the polarity of an input signal change with a single comparator. A digital logic circuit coupled to the output of the comparator, controls bi-directional current flow in a feedback loop which includes the storage capacitor. Such current flow selectively raises or lowers the potential on the first comparator input terminal to achieve equality of the potentials appearing on the comparator input terminals. That is, the circuit acts to charge the storage capacitor to the difference between the respective input signal and reference potentials. This design approach is noteworthy since it causes the incrementing currents to be supplied at constant potential with respect to the positive and negative supply voltages, so that a simple resistor is sufficient to determine the feedback current for all input conditions. Voltage-independent current sources, which might otherwise be required and which would add to the circuit complexity, are not needed. Also, in accordance with the output "delta" format, pulses are supplied on a pair of output lines, which are indicative of respective positive and negative changes in the input signal magnitude.

As will be described in detail hereinafter, depending upon particular applications, the stability of the incrementing current with temperature changes may be improved by substituting CMOS analog switch devices for the diodes present in the basic circuit, and an additional amplifier stage may be interposed between the storage capacitor and the comparator to improve the switching speed of the latter, thereby increasing the allowable frequency of the input signals.

Finally, the constant potential analog-to-digital converter input provides a convenient point for input multiplexing.

The foregoing operation is characterized by low power requirements and hardware simplicity. Other features and advantages of the present invention will become apparent in the detailed description appearing hereinafter.

DESCRIPTION OF THE PREFERRED EMBODIMENTS

Figure 1:
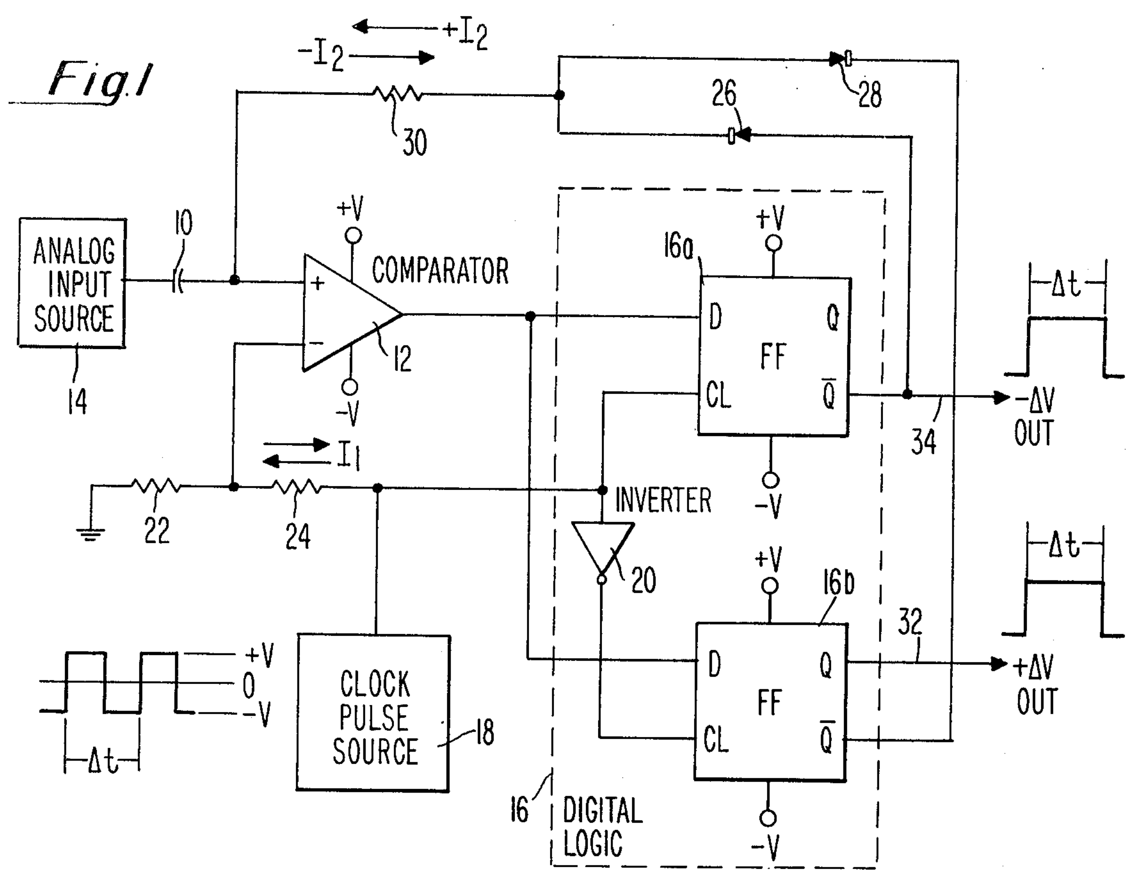
FIG. 1 is a simplified schematic diagram of the basic analog-to-digital conversion system according to the present invention.

With reference to FIG. 1, a schematic of the basic circuit embodiment of the invention is presented.

The circuit is comprised of a storage and coupling capacitor 10 having a pair of terminals and a comparator 12 having positive and negative input terminals and an output terminal. A low impedance source 14 of analog signals is coupled to one terminal of capacitor 10 and the other terminal of the latter is coupled to the positive input terminal of comparator 12.

Digital logic means 16 comprised of a pair of D-type flip-flop devices **16*a* and 16*b* are provided. Each flip-flop includes a "D" input terminal, a clock (CL) input, and a pair of output terminals, designated respectively Q and $\overline{Q}$. The D input terminals of flip-flop 16*a* and 16*b* are coupled in common to the output terminal of comparator 12. Clock pulses from a source 18 thereof are applied directly to the CL terminal of flip-flop 16*a* and via inverter 20 to the CL terminal of flip-flop 16*b*. Clock pulses, attenuated by a resistor divider comprising resistors 22 and 24 are applied to the negative input terminal of comparator 12. The $\overline{Q}$ output terminals of flip-flops 16*a* and 16*b* are coupled by way of respective diodes 26 and 28, and resistor 30 to the positive input terminal of comparator 12. The "delta" output pulses, "$+\Delta V$" and "$-\Delta V$", appearing respectively on lines 32 and 34 are derived from the Q output of flip-flop 16*b* and the $\overline{Q}$ output of flip-flop 16*a*. Supply potentials are provided to the comparator 12 and the flip-flops 16*a* and 16*b*** by way of the terminals designated $+V$ and $-V$ for each of the devices.

Figure 2:
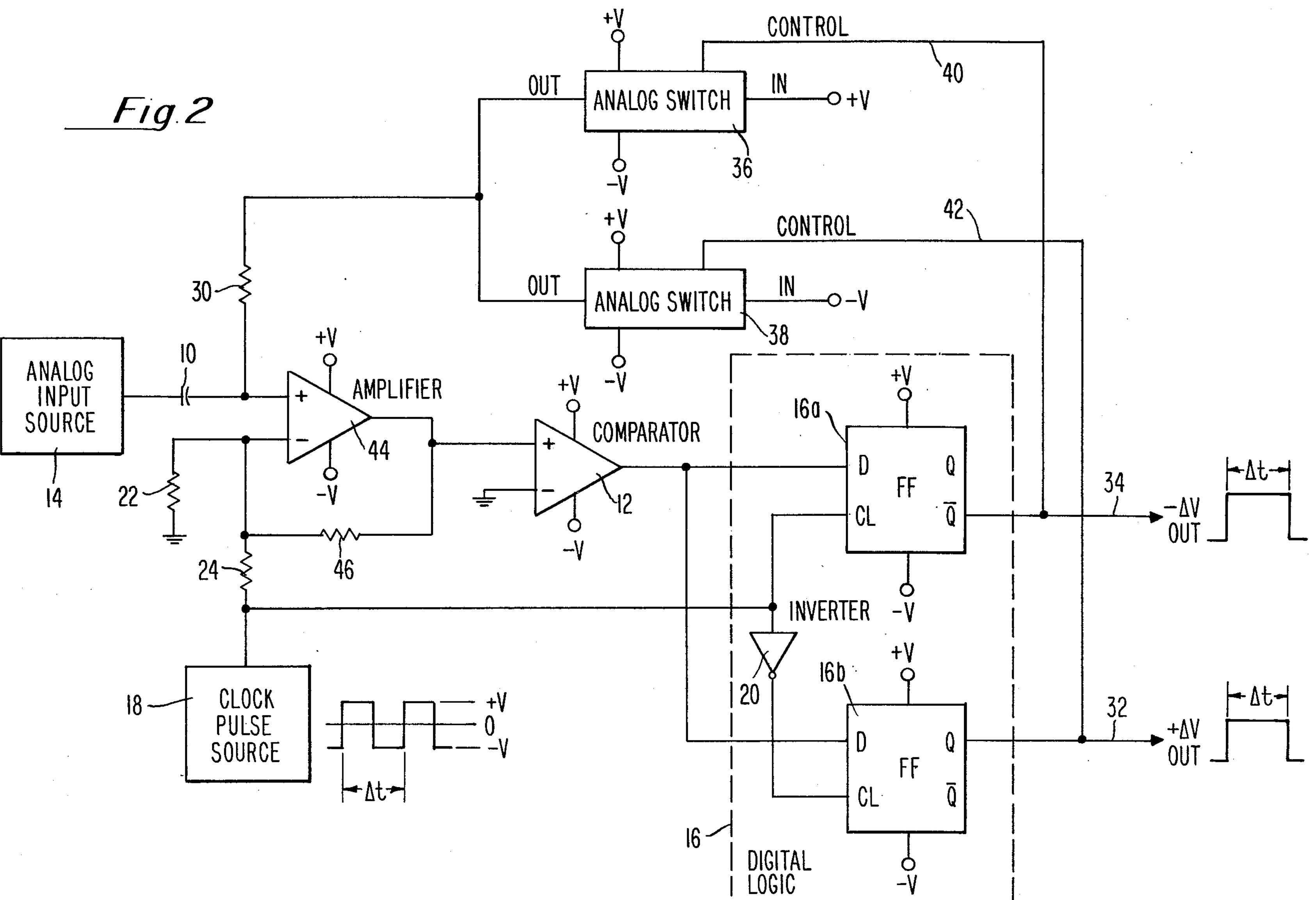
FIG. 2 is a more detailed schematic of another embodiment of the present invention.

While the basic circuit of FIG. 1 is suitable for many applications, the circuit of FIG. 2 contains certain modifications which eliminate the temperature-dependence of the diodes 26 and 28 in the incrementing loop and increase the sensitivity and speed of operation of the system. Identical reference characters have been used to identify like components in FIGS. 1 and 2.

In the circuit of FIG. 1, the current through resistor 30 is a function of the absolute magnitude of the supply potential, V, less the drop across either diode 26 or 28. The value of resistor 30 is therefore calculated on this basis. However, the diode drop varies with temperature and represents a source of temperature-dependent error. While this factor is not significant in many applications, it may be eliminated through the use of the circuit of FIG. 2, which nevertheless makes use of the identical inventive concepts of the basic circuit of FIG. 1.

In the last mentioned circuit, the diodes 26 and 28 have been replaced, respectively, in FIG. 2 by CMOS analog switches 36 and 38. Such switches are well known in the electronics art. Thus, switches 36 and 38 are open if the control voltages appearing respectively on lines 40 and 42, and applied thereto, are at the negative supply potential "−V", and closed with low impedance if the control inputs are at the positive supply level, "+V". No offset voltages, as occur in the diodes 26 and 28, are present in the analog switches 36 and 38. Hence, there is no temperature dependence of the incrementing current. Leakage current through the off or open switches is typically of the order of a few picoamperes.

Operation of the circuit of FIG. 1 is as follows. It is assumed initially that the analog signal input from source 14 is zero and that there is no charge on capacitor 10. The comparator 12 is toggled, that is, driven repeatedly in consecutive positive and negative directions, by attentuated square wave clock pulses. The latter produce bidirectional current flow $I_1$, and the voltages at the junction of resistors 22 and 24 are applied to the negative input terminal of comparator 12. The voltage levels appearing on the comparator output terminal are respectively "high" when the clock pulse is "low" and "low" when the clock pulse is "high". The propagation delay from the comparator negative input terminal to its output terminal causes the output to lag the clock slightly, for example, by a few microseconds. Flip-flops 16*a* and 16*b* are each edge-triggered on the positive going portion of the inputs on the CL terminals. Flip-flop 16*b* is driven by an inverted clock pulse, provided by inverter 20. Thus, flip-flop 16*a* is triggered with its D input "high", and flip-flop 16*b* with its D input low. As a result, flip-flop 16*a* remains continuously in the "set" state with its Q output terminal "high", and $\overline{Q}$ low. Flip-flop 16*b* on the other hand, remains "reset" with Q, "low" and $\overline{Q}$, "high". Under these conditions, diodes 26 and 28 are reverse-biased and no current flows through resistor 30.

It should now be assumed that the input analog signal goes positive by a voltage equal to $$\frac{VR_{22}}{R_{22}+R_{24}}.$$

As this limit is passed, the output of comparator 12 will remain "high" with a "high" or positive clock, and when the clock goes "low" or negative, flip-flop 16*b* will be triggered with its D input terminal "high". Flip-flop 16*b* will thus change state; its $\overline{Q}$ output terminal will go "low", and current, $-I_2$, will flow from capacitor 10, through resistor 30 via diode 28, and flip-flop 16*b*, thereby lowering the potential at the positive input terminal of comparator 12. Concurrently, the "+ΔV" output on line 32 will go "high", indicating the attainment of a positive increment of signal input. If the input signal does not change appreciably during one clock cycle, and if $$\frac{V\Delta t}{R_{30}C_{10}}$$

is approximately equal to $$\frac{VR_{22}}{R_{22}+R_{24}},$$

the initial conditions described hereinbefore will be reestablished at the end of one clock cycle. The $\overline{Q}$ output terminal of flip-flop 16*b* will go "high", terminating the charge increment, as well as the "+ΔV" output. On the other hand, this process will be repetitive if the input signal continues to increase in a positive direction.

A similar process occurs when the input analog signal exhibits a negative change in its amplitude. In this case, the output of comparator 12 will remain "low" with a "low" or negative clock, and when the clock goes "high" or positive, flip-flop 16*a* is triggered with its D input "low" and output terminal $\overline{Q}$ of flip-flop 16*a* goes "high", supplying current, $+I_2$, through diode 26 and resistor 30 to charge capacitor 10 and raise the potential at the positive input terminal of comparator 12. At the same time, a positive pulse, "−ΔV", is delivered on line 34, signifying the negative change in the analog input.

The operation of the incrementing loop of FIG. 2 is substantially identical to that of FIG. 1 except that the control voltage for analog switch 38 which appears on line 42 is derived from the Q output terminal of flip-flop 16*b* rather than the Q output, as was the case with diode 28. This change was required because of the positive/-true logic function inherent in the analog switch, wherein the switch closure is a function of a positive control signal.

FIG. 2 also depicts the addition of an amplifier 44, interposed between the source 14 of analog signals to be digitized and comparator 12. Thus, one side of the storage/coupling capacitor 10 is coupled to the positive input terminal of amplifier 12. Also, one side of resistor 30 is coupled to the last mentioned amplifier terminal, completing the incrementing loop. The source 18 of clock pulses is coupled to the negative input terminal of amplifier 44 via the voltage divider resistors 22 and 24. The output terminal of amplifier 44 is coupled to the positive input terminal of comparator 12, while the negative input terminal of comparator 12 is connected to a reference potential, which is conveniently, but not necessarily ground. The output terminal of comparator 12 remains coupled to the respective D input terminals of flip-flops 16*a* and 16*b* as in FIG. 2.

Resistor 46 in combination with resistors 22 and 24 determines the gain of amplifier 44, which in an actual operative embodiment is approximately twenty. This additional amplification as compared with FIG. 1, improves the switching speed of comparator 12 and permits 1 KHz. operation at increment levels of less than 1 millivolt. Since amplifier 44 must amplify a square wave at clock frequency, the achievable amplification is limited by the gain-bandwidth product of amplifier 44. A 100 KHz., gain-bandwidth product permits an adequate risetime for 1 KHz. operation. However, it is not essential that the amplifier output reach its full value in half a clock cycle, since the square wave toggle voltage and the increment voltage are combined at the inputs of amplifier 44 and amplified equally. It should be understood that the foregoing parameters are for micropower operation of the converter system, for example, 100 microamperes or less at a supply voltage of ±3 volts. The use of higher current-drain active devices will permit higher frequency operation for wider band applications.

The operation of the circuit of FIG. 2 is substantially the same as that of FIG. 1. With zero analog signal input and no charge on capacitor 10, the amplifier 44 is toggled by attenuated square wave clock pulses from source 18. The voltage levels on the amplifier output terminal are respectively "high" when the clock pulse is "low", and "low", when the clock pulse is "high". Since this amplifier output is applied to the positive terminal of comparator 12, which has its negative terminal connected to a reference (ground) potential, the output of comparator 12 follows the polarity of that of the amplifier. As in the circuit of FIG. 1, flip-flop 16*a* remains "set" with its $\overline{Q}$ output, "low"; and flip-flop 16*b* remains reset, with its Q output, "low". Under these conditions, control lines 40 and 42 are both "low", and analog switches 36 and 38 are both open. No increment current flows through resistor 30.

If the input analog signal goes positive, flip-flop 16*b* will be set and its Q output terminal will go "high". The control signal on line 42 will also go "high", closing analog switch 42 and causing current to flow from capacitor 10, through resistor 30 and switch 38, thereby lowering the potential on the positive input terminal of amplifier 44. A positive pulse, "$+\Delta V$", lasting for one clock cycle, that is $\Delta t$, is also produced on line 32, indicating the occurrence of the positive change in the input signal.

If the input signal from source 14 goes negative, flip-flop 16*a* will be reset, causing its Q terminal to go "high". The control signal on line 40 will also go "high", closing analog switch 36 and permitting current flow to charge capacitor 10 and to raise the potential on the positive terminal of amplifier 44. Concurrently, a positive pulse, "$-\Delta V$", lasting for a time $\Delta t$, is produced on line 34, signifying the negative change in the analog input.

Figure 3:
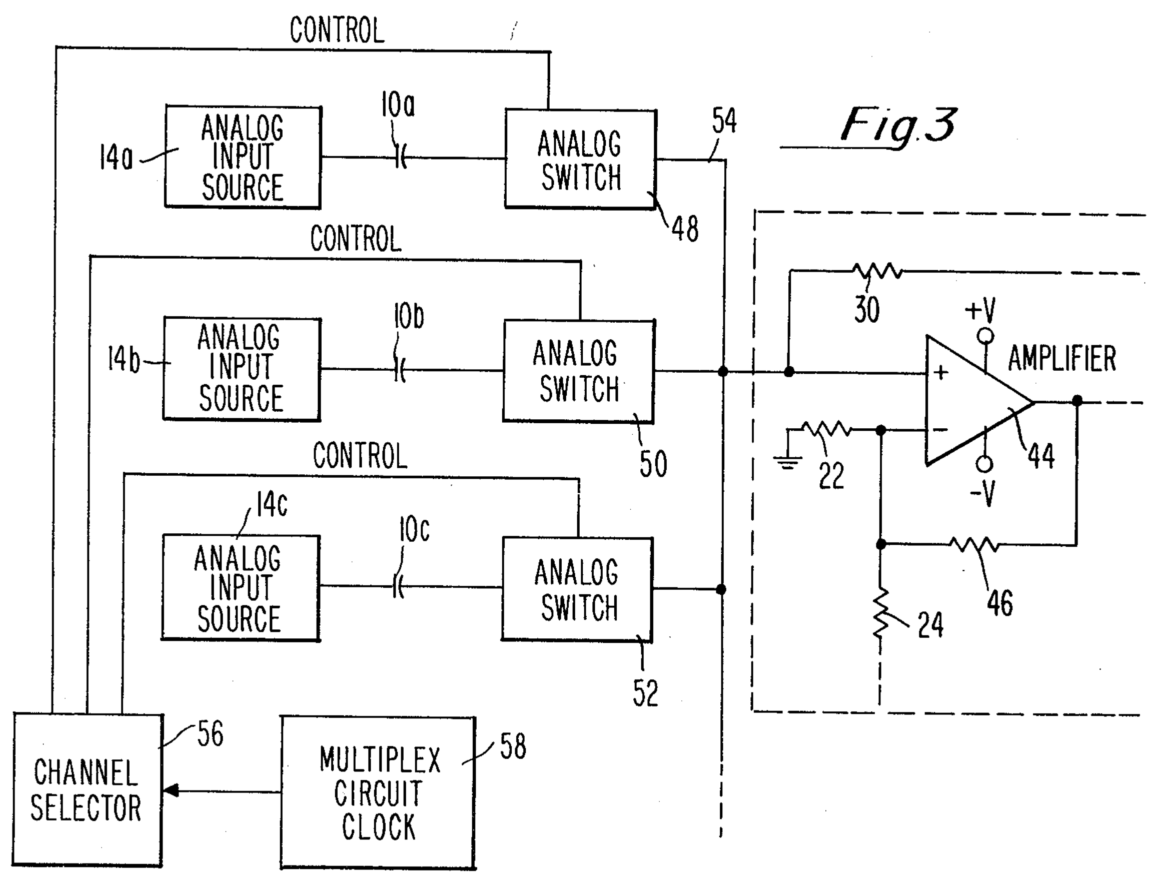
FIG. 3 is a partial schematic illustrating a method of multiplexing the inputs to the converters of FIGS. 1 and 2.

The constant potential analog-to-digital converter input provides a convenient point for input multiplexing. A partial schematic of a multiplexing technique utilizing the present invention is depicted in FIG. 3. Portions of the circuit not shown, as indicated by the dashed lines associated with resistor 30 and amplifier 44 are assumed to be identical to those of FIG. 2. Each of the analog input sources 14*a*, 14*b* and 14*c* are coupled through respective capacitors 10*a*, 10*b* and 10*c* and analog switches 48, 50 and 52 to a common bus 54. The desired analog switch is closed by a channel selector 56 actuated by the multiplex circuit clock 58, the selector applying a control pulse to the switch control input. Concurrently, all of the other analog switches are open. The disconnected capacitors retain the respective charges and any difference between the capacitor and reference potentials upon selection, represents a signal change. There is no need for tracking between signal levels, and no attendant delay.

The relationship between the converter clock frequency and the multiplexing rate can be varied to suit the particular application. For example, a fixed number of clock cycles could be allotted per channel, or an adaptive system implemented which would allow a channel to "catch up" to accumulated signal changes before switching to the next input. Moreover, the multiplex clock may desirably be synchronized with the converter clock although such a condition is not mandatory provided only that no input switching takes place while capacitor charging is in progress.

In actual operative embodiments of the circuits of FIGS. 1–3 inclusive, the comparator 12 and the amplifier 44 comprised respectively corresponding sections of a standard integrated circuit such as the Motorola MC14575. The analog switches 36 and 38, as well as 48, 50 and 52, were implemented by sections of RCA CD 4066. Also, the D-type flip-flops 16*a* and 16*b* were sections of RCA CD 4013. It must be emphasized that these and other circuit details found herein are presented solely for purposes of example to enable the reader to better appreciate the circuit operation. They are not to be construed as restricting the inventive concepts taught herein.

In summary, there has been described a practical analog-to-digital converter capable of providing a "delta" format digital output and characterized by simple hardware and low operating power requirements. It should be understood that changes and modifications of the arrangements described herein may be required to fit particular operating requirements. All such modifications and changes, insofar as they are not departures from the true scope of the invention are intended to be covered by the following claims.

What is claimed is:

1. An analog-to-digital converter system for converting input AC signals derived from at least a single source thereof to delta-format digital output pulses comprising:
   - capacitive means having a pair of terminals, one terminal of which is connected to a source of AC signals for storing a charge representative of the amplitude thereof,
   - comparison means coupled to the other terminal of said capacitive means, a reference potential and means for incrementally varying the latter potential by superimposing a component of voltage thereon, said comparison means comparing the potential corresponding to the charge on said capacitive means with said reference potential and providing periodic voltage transitions in response to the incremental variation of the reference potential when the potentials being compared are substantially equal and further providing voltage levels in the absence of said voltage transitions when said last mentioned potentials are unequal,
   - digital logic means coupled to said comparison means and being responsive to said voltage levels for generating said delta-format digital output pulses as indicative of a predetermined increment of change in the amplitude of said AC signals,
   - a feedback loop coupling said digital logic means to said other terminal of said capacitive means, said feedback loop being actuated by said digital logic means, concurrently with the generation of said delta-format digital output pulses, by causing selective bipolar currents to flow therein for a predetermined time, said bipolar currents restoring a balanced condition by charging said capacitive means to the difference in potential between a given amplitude AC signal and said reference potential, the direction of said bipolar currents being determined by said voltage levels provided by said comparison means.

2. An analog-to-digital converter system as defined in claim 1 further characterized in that said means for incrementally varying said reference potential is a clock pulse source of bipolar square waves.

3. An analog-to-digital converter system as defined in claim 2 further characterized in that said bipolar square waves supplied by said clock pulse source are symmetrical about said reference potential with a peak amplitude approximately equal to the desired digitization threshold.

4. An analog-to-digital converter system as defined in claim 3 wherein said comparison means includes a comparator, said comparator having a positive and a negative input terminal and an output terminal, said capacitive means being coupled to said positive input terminal of said comparator, voltage divider means comprised of a pair of series connected resistors having one extremity thereof coupled to said clock pulse source and its other extremity to said reference potential, the junction of said series connected resistors being coupled to said negative input terminal of said comparator.

5. An analog-to-digital converter system as defined in claim 3 wherein said comparison means includes an amplifier and a comparator, said amplifier having a positive and a negative input terminal and an output terminal, said capacitive means being coupled to said positive input terminal of said amplifier, voltage divider means comprised of a pair of series connected resistors having one extremity thereof coupled to said clock pulse source and its other extremity to said reference potential, the junction of said series connected resistors being coupled to said negative input terminal of said amplifier, said comparator having a positive and a negative input terminal and an output terminal, the output terminal of said amplifier being coupled to said positive input terminal of said comparator, the negative input terminal of said comparator being coupled to said reference potential.

6. An analog-to-digital converter system as defined in claim 4 wherein said digital logic means comprises a first and a second D-type flip-flop, each having a "D" input terminal, a "CL" input terminal, and respective "Q" and "$\overline{Q}$" output terminals, said output terminal of said comparator being coupled in common to the "D" input terminals of said first and second flip-flops, said clock pulse source being coupled to the "CL" input terminal of said first flip-flop, and logical inverter means coupling said clock pulse source to the "CL" input terminal of said second flip-flop.

7. An analog-to-digital converter system as defined in claim 5 wherein said digital logic means comprises a first and a second D-type flip-flop, each having a "D" input terminal, a "CL" input terminal, and respective "Q" and "$\overline{Q}$" output terminals, said output terminal of said comparator being coupled in common to the "D" input terminals of said first and second flip-flops, said clock pulse source being coupled to the "CL" input terminal of said first flip-flop, and logical inverter means coupling said clock pulse source to the "CL" input terminal of said second flip-flop.

8. An analog-to-digital converter system as defined in claim 6 wherein said feedback loop comprises a resistor and first and second diodes, each diode having an anode and a cathode, one extremity of said resistor being coupled to said positive input terminal of said comparator and the other extremity of said resistor being coupled in common to the respective cathode and anode of said first and second diodes, the respective anode and cathode of said first and second diodes being coupled respectively to the "$\overline{Q}$" terminals of said first and second flip-flops, said delta-format digital output pulses indicative respectively of negative and positive changes in the amplitude of an AC analog signal, appearing on the respective "$\overline{Q}$" and "Q" output terminals of said first and second flip-flops, each of said digital output pulses having a duration equal to that of a single clock pulse cycle.

9. An analog-to-digital converter system as defined in claim 7 wherein said feedback loop comprises a resistor and first and second analog switches, each switch having an input terminal, an output terminal and a control terminal, one extremity of said resistor being coupled to said positive input terminal of said amplifier and the other extremity of said resistor being coupled in common to the respective output terminals of said first and second analog switches, the input terminals of said first and said second switches being coupled respectively to positive and negative supply potentials, the control electrodes of said first and second analog switches being coupled respectively to the "$\overline{Q}$" and "Q" output terminals of said first and second flip-flops, said delta-format digital output pulses indicative respectively of negative and positive changes in the amplitude of an input AC signal, appearing on the respective "$\overline{Q}$" and "Q" output terminals of said first and second flip-flops, each of said digital output pulses having a duration equal to that of a single clock pulse cycle.

10. An analog-to-digital converter system as defined in claim 9 further characterized in that said capacitive means comprises a plurality of capacitors, each of said capacitors being coupled to a separate source of AC signals, a plurality of analog switches for coupling said capacitors in common to the positive input terminal of said amplifier, said analog switches having respective control terminals, channel selector means coupled to said control terminals and being responsive to multiplex clock pulses applied thereto, for selectively closing each of said analog switches to permit the digitization of the AC signal coupled therethrough.

* * * * *